United States Patent [19]

Payne

[11] Patent Number: 5,140,703
[45] Date of Patent: Aug. 18, 1992

[54] MODULATION DISTORTION ANALYZER

[76] Inventor: Christopher P. Payne, 5505 Brile Dr., Bethesda, Md. 20817

[21] Appl. No.: 257,614

[22] Filed: Oct. 14, 1988

[51] Int. Cl.[5] .................. H04B 17/00; H04B 1/10
[52] U.S. Cl. .................. 455/226.1; 455/295; 455/324; 324/77 B
[58] Field of Search ............ 455/182, 183, 209, 260, 455/192, 316, 226, 295, 227, 324; 328/160, 165, 167; 324/77 B, 79 R

[56] References Cited

U.S. PATENT DOCUMENTS

| | | | |
|---|---|---|---|
| 3,519,740 | 7/1970 | Gassmann | 455/324 |
| 3,609,557 | 9/1971 | Goell | 375/84 |
| 3,626,301 | 12/1971 | Develet | 455/316 |
| 3,665,304 | 5/1972 | Maybach | 324/85 |
| 3,992,670 | 11/1976 | Gittins et al. | 455/226 |
| 4,472,685 | 9/1984 | Dutasta | 455/260 |
| 4,476,585 | 10/1984 | Reed | 455/209 |
| 4,542,346 | 9/1985 | McNeilly | 328/160 |
| 4,556,988 | 12/1985 | Yoshisato | 455/192 |
| 4,580,101 | 4/1986 | Lax | 455/260 |
| 4,742,566 | 5/1988 | Nordholt et al. | 455/260 |
| 4,748,683 | 5/1988 | Sato | 455/192 |
| 4,792,993 | 12/1988 | Ma | 455/266 |

Primary Examiner—Reinhard J. Eisenzopf
Assistant Examiner—Andrew Faile
Attorney, Agent, or Firm—Welsh & Katz, Ltd.

[57] ABSTRACT

There is disclosed a method and apparatus for demodulating an R.F. modulated signal having a known carrier frequency Fo. A first reference signal of a frequency matching approximately the carrier frequency Fo, is mixed with the input R.F. modulated signal to produce the demodulated signal. The first reference signal is generated by a reference oscillator which provides a second reference signal of a second distinct reference frequency, a voltage control oscillator for generating the first reference signal dependent upon the amplitude of an error signal applied thereto, a selectively variable divider circuit for receiving and dividing the first frequency by a selected number to provide a third divided signal, and a comparator for comparing the phase of the second reference signal with that of the third divided signal to generate and apply the error signal to the voltage control oscillator. The demodulated signal is applied to the reference oscillator, whereby the second frequency varies in accordance with the phase of the demodulated signal and the first frequency is phase-locked to the carrier frequency Fo. A selected spectrum window of the demodulated signal is provided by generating a fourth reference signal of a frequency offset from the carrier frequency Fo and by multiplying that offset reference signal by the demodulated signal to provide a difference signal indicative of the difference therebetween centered about the offset frequency. The difference signal is filtered to pass only those frequencies below a selected first frequency to provide a spectrum window whose bandwidth is limited to that segment of the demodulated or base band signal to be examined.

31 Claims, 9 Drawing Sheets

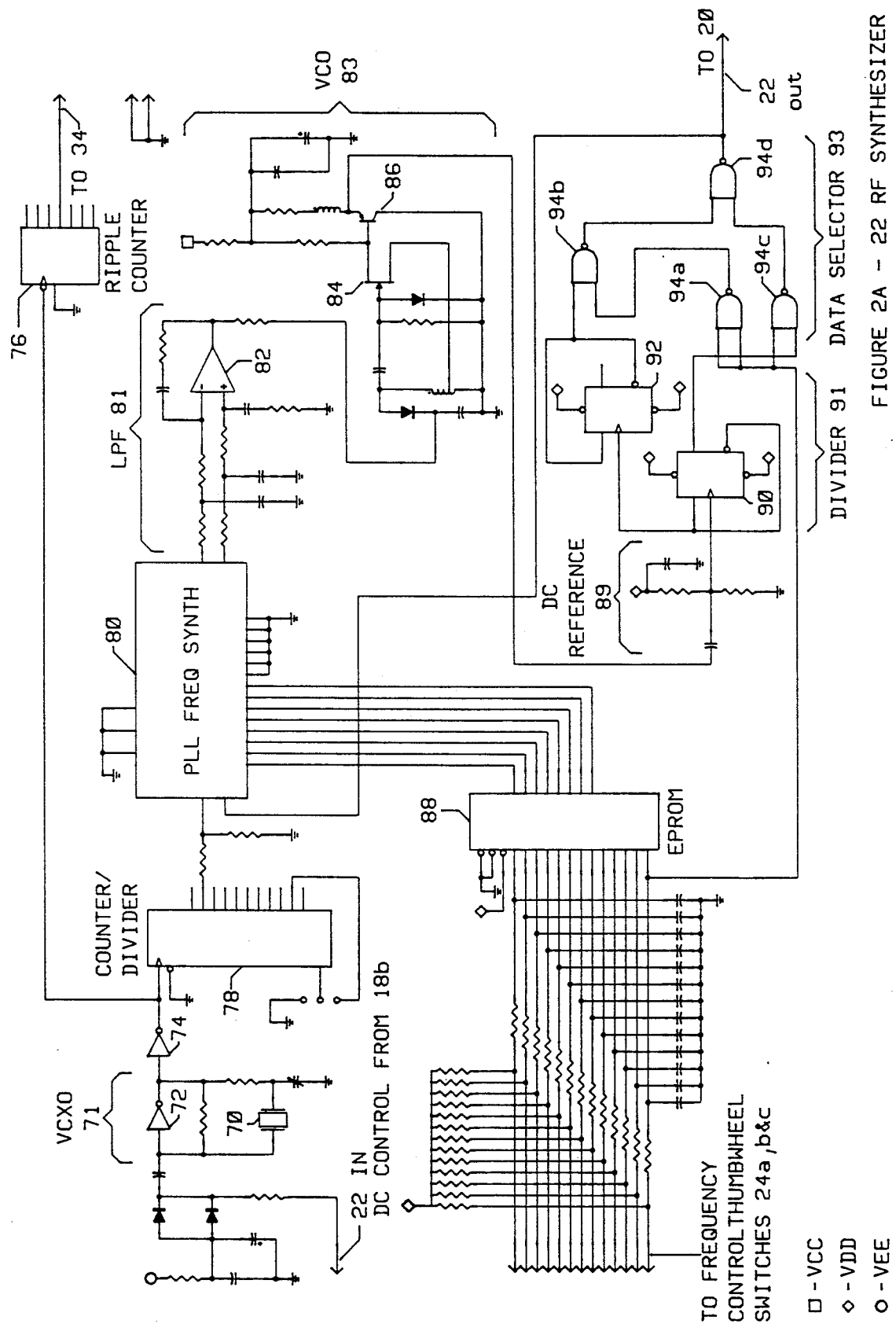

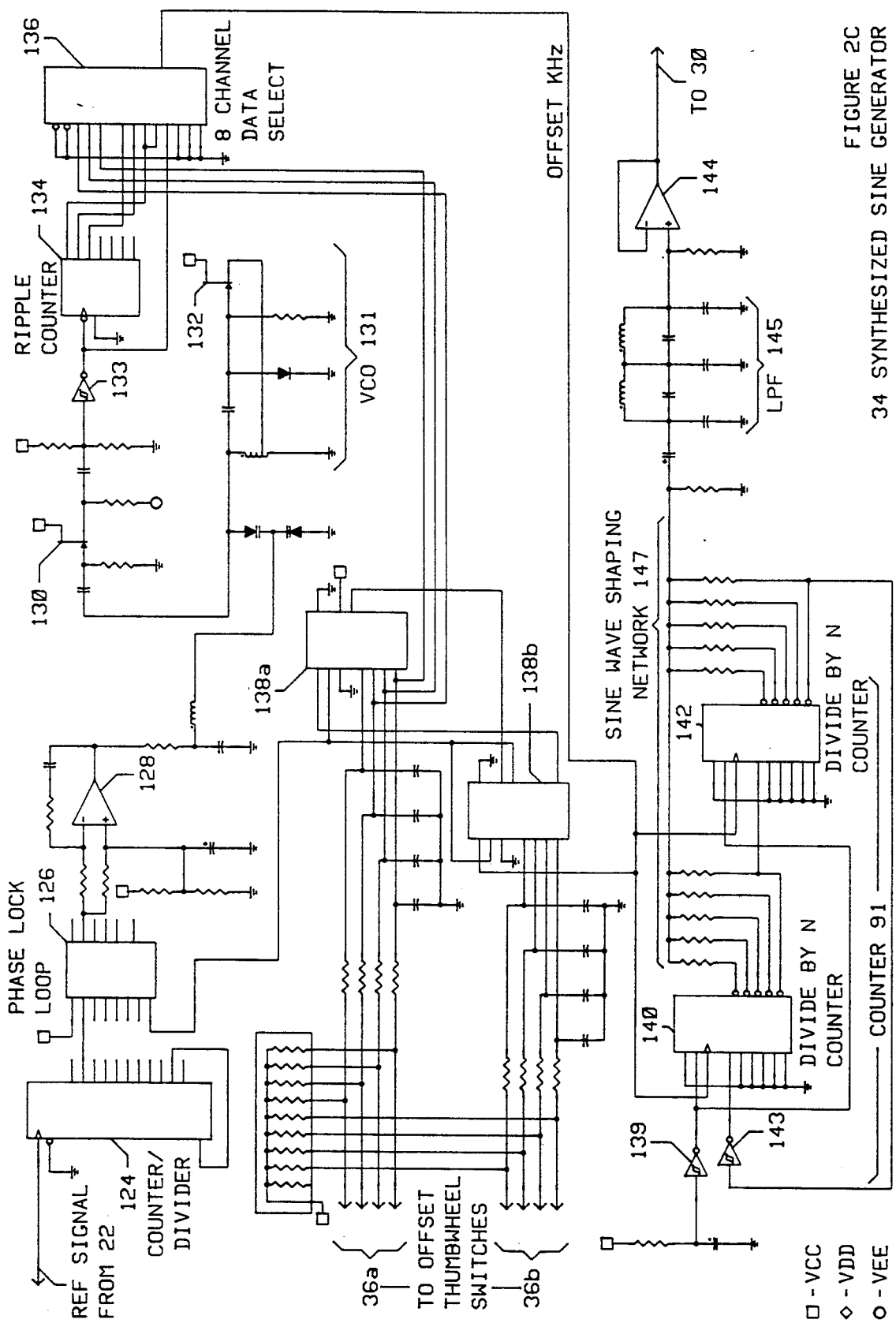

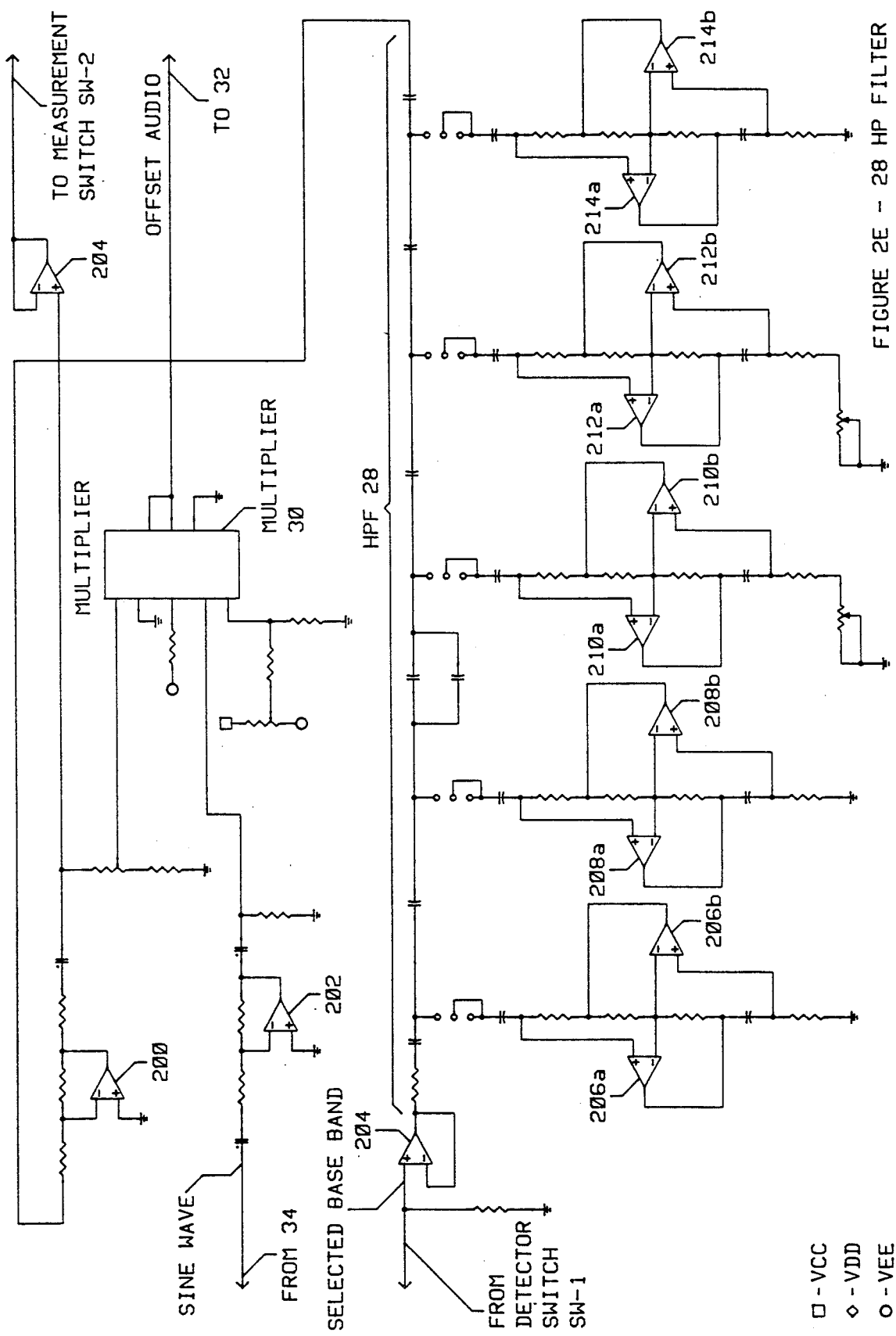
FIGURE 2E – 28 HP FILTER

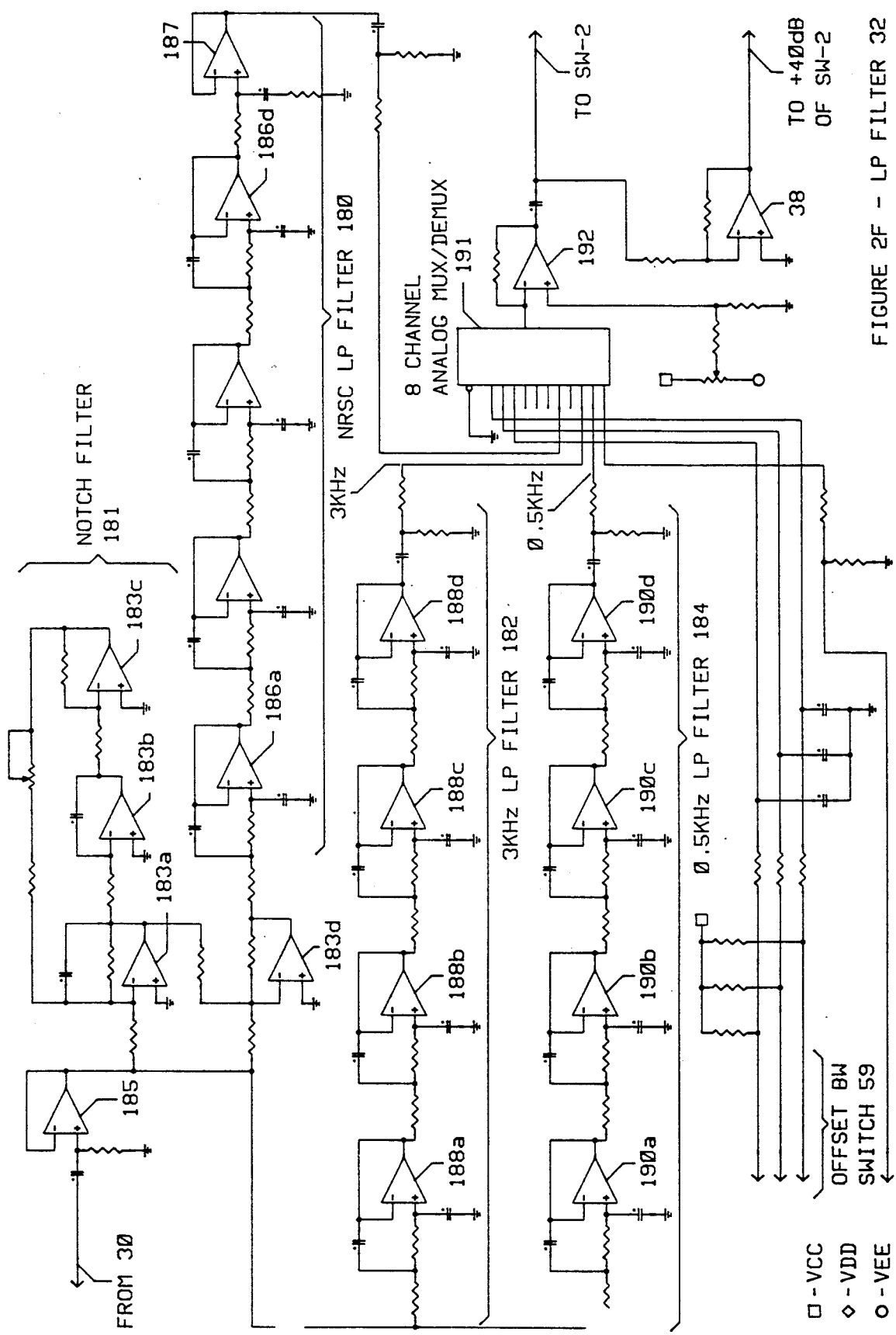
FIGURE 2F - LP FILTER 32

SIDEBAND LEVEL TEST CHART

MODULATION DISTORTION ANALYZER

FIELD OF THE INVENTION

This invention relates to the apparatus and method for analyzing modulation distortion signals and, in particular, examining a selected band of signals on either side of the carrier frequency of amplitude modulated broadcast signals.

DESCRIPTION OF THE PRIOR ART

Modulation distortion, which appears on either side of the carrier frequency of an AM broadcast signal, is a problem, because it interferes with the reception of other stations. Nearly everyone has experienced the steam-locomotive-like sound of second adjacent channel interference while trying to receive a weak AM radio signal, especially at night. The effect is due to sidebands generated by another radio station. The presence of such sidebands does not necessarily indicate a violation of Federal Communications Commission FCC emission limitations rules because the receiver's automatic gain control brings up the modulation distortion along with the weak signal.

Several secondary effects of modulation distortion are harmful to the AM transmission. The existence of such noise from thousands of radio stations raises the general noise level of the AM band and thereby reduces the quality of all AM broadcast programming. Also, modulation distortion is energy wasted because the adjacent sidebands are never audible to the station's listeners. In fact, the signals which cause modulation distortion may intermodulate in the transmitter to produce distortion components within the desired portion of the spectrum and, therefore, distortion in the received signal.

The distortion of concern in AM broadcast signals is that undesired portion of an AM station's output spectrum primarily caused by modulation. Finally, the modulation distortion of concern is defined in terms of the station's output spectrum, which may be measured at the transmitter's output or from and the far field spectrum.

AM preemphasis is the boosting of high audio frequencies prior to modulation and transmission. Many AM stations use preemphasis in an attempt to compensate for the "narrow" response of most AM receivers. Analysis has shown that the boosting of such high audio frequencies results in R.F. emission of increased amplitudes at greater offset from the carrier frequency Fo. Typically, such AM preemphasis and the resultant modulation distortion may interfere with AM receivers tuned to neighboring stations located on adjacent AM channels.

The primary cause of modulation distortion is higher frequency audio components at the transmitter's modulator input. In a publication entitled *Modulation, Over Modulation, And Occupied Bandwidth: Recommendations for the AM Broadcast Industry*, NAB September 1986, the author Harrison J. Klein pinpoints the primary cause of such modulation distortion as the excessive high frequency content in the modulating audio. These higher frequency audio signals are translated directly into sidebands by the normal process of modulation. A typical source of these audio signals is an improperly filtered clipper in the audio processor. Fortunately, the better audio processors incorporate a low overshoot filter to eliminate these clipping products.

Other sources of excessive sidebands are overmodulation, improper use of the transmitter's protective clippers, distortion and noise in the modulator, incidental phase modulation (IPM), and improperly operated AM stereo. In the case of IPM, the resulting phase modulation sideband pairs would not, if left undisturbed, affect receiver envelope detectors tuned to the desired station. However, these sidebands are disturbed by every tuned circuit all the way through to the detector, especially the asymmetrical skirts of the IF bandpass. So some of this sideband energy is converted to AM sidebands which are detected as distortion. This is why reduction of IPM by proper transmitter neutralization improves the sound of AM stations.

The regulation of the FCC governing emission limitations do not currently specify the monitoring equipment to be used or the frequency of measurement but specify only that the transmission must not violate the internationally agreed upon spectrum limits. Thus, strictly speaking, the broadcaster must guarantee at all times that he is not violating these limits. In practice, however, the spectrum is checked only periodically, perhaps once a year, using a rented or borrowed spectrum analyzer or wave analyzer. The assumption is made that the spectrum is acceptable at all other times. Until now, this was the only practical recourse available to the broadcaster due to the high cost of the necessary measurement equipment and the requirement for competent technical people to operate the complex equipment.

Other equipment readily available, such as communication receivers and field strength meters, are not suitable for close-in spectrum measurements because they lack the necessary dynamic range and selectivity. In addition to the relatively high cost, a high quality spectrum analyzer has the technical limitation that as it sweeps through the measurement band, it looks at only a small segment of the spectrum at any given time. Thus, the spectrum analyzer may not record the existence of a burst of modulation distortion. Klein notes at page 22 of the above referenced report that the band width of AM transmission can be accurately measured with conventional swept-filter R.F. spectrum analyzer if the modulating waveform is noise, but that such measurements are inaccurate on program material because the filter may miss the transients that are primary sideband components. If the sideband is envelope-detected and analyzed for spurious audio components, such modulation distortion cannot be differentiated from the distortion components that are generated in the envelope-detector.

The amplitude level of the modulation distortion of concern normally decreases with frequency away from the carrier frequency Fo. Reflecting such decrease, the rules of the FCC specify that the maximum acceptable level produced on the second adjacent channels, 20 kHz away from, and on both sides of the carrier frequency Fo is 25 db below the amplitude level of the carrier fundamental components of the transmitted signal. The National Radio Systems Committee (NRSC), an industry sponsored committee of AM broadcast stations, AM receiver manufacturers and broadcast equipment suppliers, has proposed an interim voluntary national standard that specifies R.F. spectrum emission for AM broadcast stations, whereby second-adjacent channel interference may be substantially attenuated. Referring now to FIG. 4, there is shown a graph of the permitted amplitude of the R.F. emission as a function of the frequency offset from the carrier frequency Fo in terms of kHz. The solid line indicates the present maximum emission established by the rules of the FCC. On Apr. 7, 1988, the NRSC published its interim voluntary national standard in terms of an NRSC maximum, indicated by the dashed line in FIG. 4, and NRSC test limits, indicated by a dotted line in FIG. 4. Thus, it is desired to measure the level of modulation distortion and spurious emissions which fall within a particular spectrum window or segment of these sidebands. An effective modulation distortion analyzer must be capable of measuring selected segments of the noise appearing on either side of the carrier frequency Fo.

Further, the amplitude levels of such noise may be changed due to factors such as shifts in modulation level, changes in program material, audio processor adjustments and tube aging. Thus, it is desired to have the capability of adjusting the particular offset and spectrum segment that can be monitored.

SUMMARY OF THE INVENTION

It is an object of this invention to provide a new and improved apparatus and method for analyzing modulation distortion which appears in the bandpass of a broadcast signal and in particular of an AM broadcast signal.

It is a more particular object of this invention to measure continuously the amplitude level of broadcast emission on both sides of the carrier of frequency Fo of an AM broadcast signal.

It is a still further object of this invention to measure a defined spectrum window or segment displaced on both sides of the carrier frequency Fo by a selected, variable frequency offset.

It is a still further object of this invention to individually examine the I and Q components of an AM broadcast signal and to measure the amplitude in each of those component signals.

It is another object of this invention to readily translate broadcast emission in the AM broadcast range into a relatively low frequency, e.g., 0 to 100 kHz, and to analyze such emissions with apparatus made up of relatively inexpensive components.

It is another object of this invention to provide a simple economical method of remotely indicating the level of modulation distortion and setting an alarm if such noise exceeds a preset limit.

BRIEF DESCRIPTION OF THE DRAWINGS

In accordance with these and other objects of this invention, there is disclosed an apparatus and method for demodulating an R.F. modulated signal having a carrier signal of a known carrier frequency Fo to provide a demodulated signal. The carrier frequency Fo of the carrier signal varies to a limited degree. A first reference signal is generated of a first frequency selected to match approximately the carrier frequency Fo. At least one mixer receives the R.F. modulated signals at its R.F. input portion of the first reference signal at its local oscillator input, to produce a demodulated signal. The first reference signal is generated by circuitry comprising a reference oscillator for producing a second reference signal of a second reference frequency, a variable or voltage control oscillator for generating the first reference signal dependent upon the amplitude of an error signal applied thereto, a selectively variable divider for receiving and dividing the first frequency of the first reference signal by a selected number to provide a third divided signal whose third frequency is proportional to the first frequency divided by the number and a comparator for comparing the phase of the second reference signal with that of the third divided signal to generate and apply the error signal in accordance with the phase difference therebetween to the voltage control oscillator, whereby the first frequency is made dependent upon the selected number. The demodulated signal is fed back and applied to the reference oscillator, whereby the second frequency varies in accordance with the phase of the demodulated signal and the first frequency of the first reference signal is phase-locked to the carrier frequency Fo of the input R.F. modulated signal.

In a further aspect of this invention, the first reference signal is phase-shifted by precisely 90° and both the first reference signal and the phase-shifted signal are applied respectively to first and second mixers for providing demodulated in-phase and quadrature signals. The quadrature demodulated signal is fed back and applied to the reference oscillator so that the phase of the demodulated in-phase and quadrature signals are phase-locked to said carrier frequency Fo of the input R.F. modulated signal.

A still further aspect of this invention permits the examination of a selected spectrum window of the demodulated signal or base band outputted by the mixer. A generator generates a reference signal of a frequency offset from the carrier frequency Fo of the modulated signal by a selected amount. The demodulated signal and the offset reference signal are applied to a multiplier, which multiplies the offset reference signal and the demodulated base band signal to provide a difference signal indicative of the frequency difference therebetween centered about the offset frequency. The difference signal is applied to a filter, which passes only those frequencies below a selected first pre-determined frequency to provide a spectrum window whose bandwidth is limited to that segment of the base band to be examined. It is further understood that the difference signal may be applied to a selected one of a plurality of filters, whereby the bandwidth of the spectrum window may be varied accordingly.

In a still further aspect of this invention, the demodulated signal may be applied to a high pass filter, which filters out the fundamental components of the base band signal. A switch is employed to select one of the demodulated signal, the filtered base band signal or the spectrum window to be applied to a meter, whereby an indication of the amplitude of the selected one signal is displayed.

Figure 1:
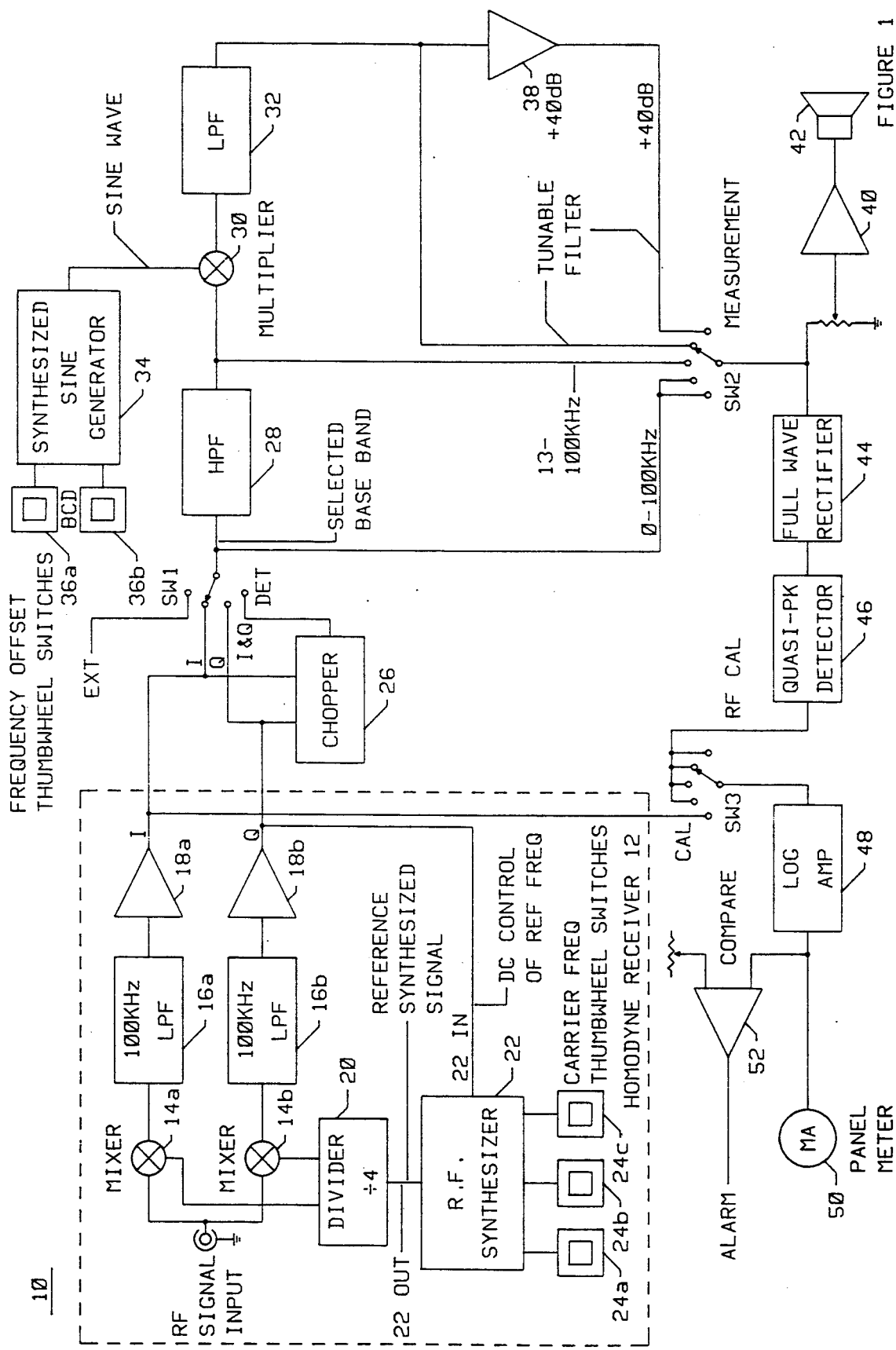
Figure 2B:
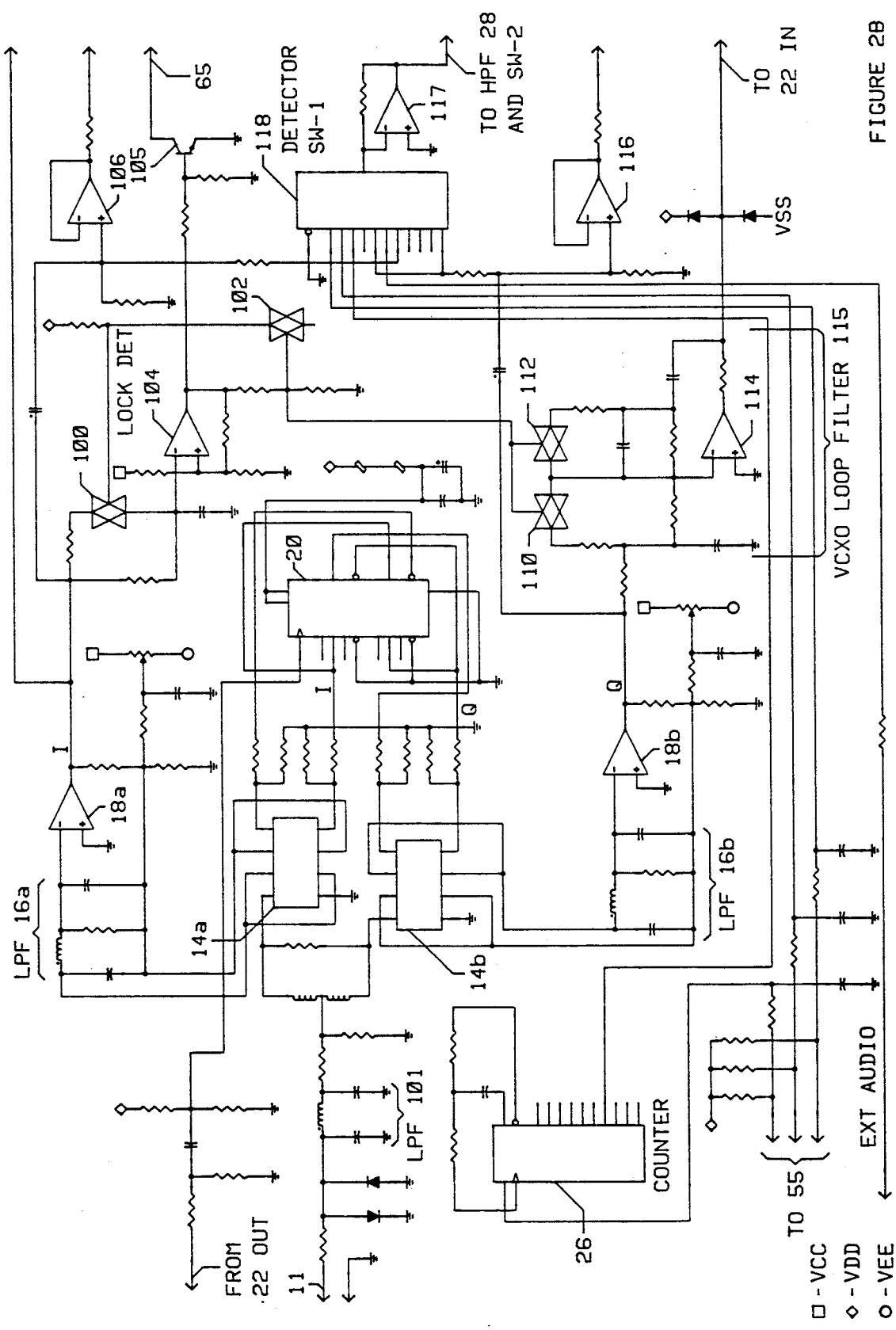
Figure 2D:
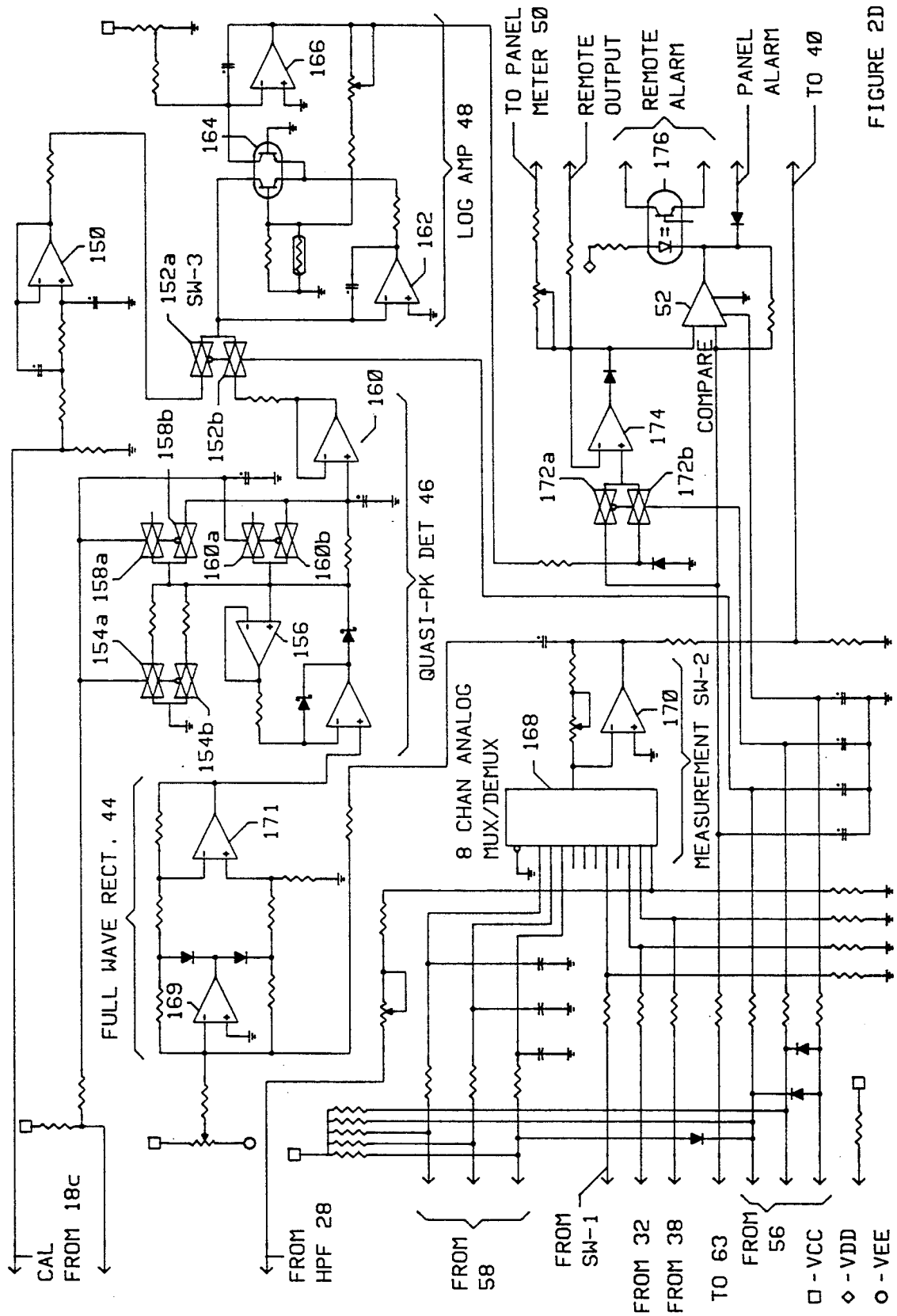
Figure 3:
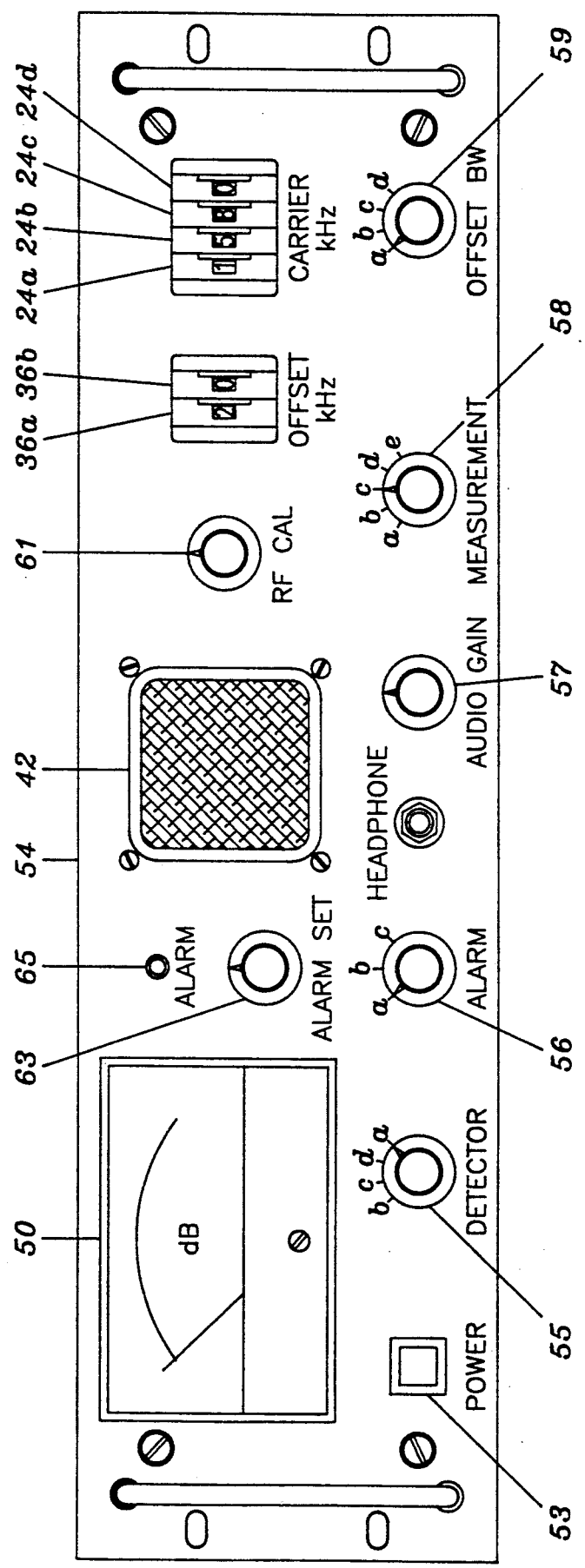
Figure 4:
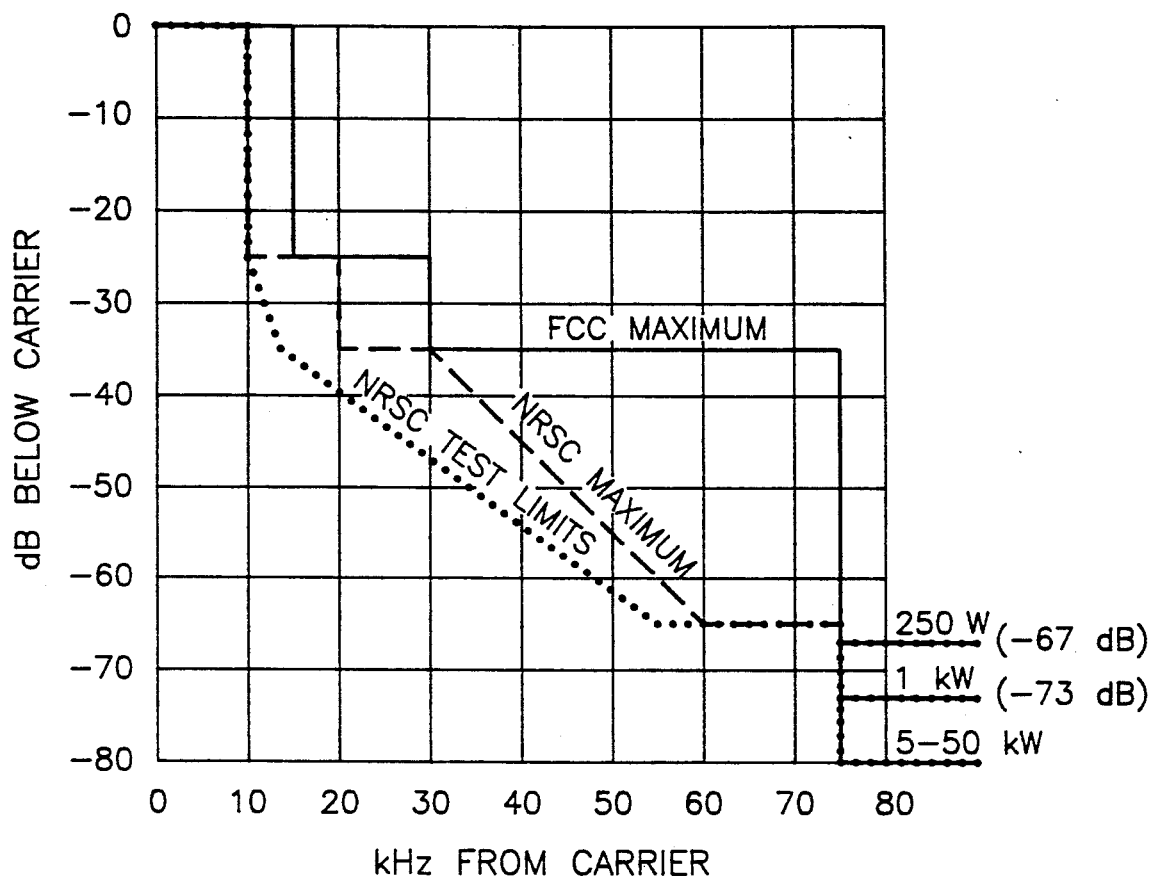

These and other objects and advantages of the present invention will become apparent by referring to the following detailed description and accompanying drawings, in which:

FIG. 1 is an overall functional block diagram of a modulation analyzer;

FIGS. 2A-2F are detailed schematic drawings of a preferred embodiment of that modulation distortion analyzer more generally shown in FIG. 1;

FIG. 3 is a front elevational view of a front panel of the modulation distortion analyzer of FIGS. 1 and 2, particularly showing the controls and display of signals outputted by the modulation distortion analyzer; and FIG. 4 is a graph showing various limits on the R.F. emission of an AM broadcast signal.

DESCRIPTION OF THE PREFERRED EMBODIMENT

Referring now to the drawings and in particular to FIG. 1, there is shown a modulation distortion analyzer 10 in accordance with teachings of this inventions. An R.F. signal as taken either from a wide bandwidth antenna or from a pick-off coil of the transmitter itself, is applied to an input terminal 11 of a homodyne receiver 12. The incoming R.F. signal is split into two components and fed to the R.F. inputs of each of a pair of mixers 14a and 14b, illustratively of the two diode ring double balanced type. The other, local oscillator input of each of the mixers 14a and 14b is connected to a divider 20, illustratively a MECL divider, which produces two switching signals in precise quadrature. In particular, the signal applied to the local oscillator input of the mixer 14a, is set as will be explained at precisely the carrier of frequency Fo of the received amplitude modulative R.F. signal, whereas the switching signal applied to the oscillator input of the mixer 14b is shifted from the carrier phase by precisely 90°. The input to the divider 20 is developed by an R.F. synthesizer 22, which causes the switching signals applied to the mixers 14a and 14b to nearly match the frequency of the input R.F. signal. A plurality of carrier frequency thumbwheel switches 24a, b and c set the frequency output of the R.F. synthesizer 22 very near the frequency of the R.F. input signal. As will be explained below, the synthesizer frequency is set to exactly the same as that of the input signal by using a phase locking technique.

The R.F. synthesizer 22 includes a reference crystal whose frequency varies to some degree dependent upon the D.C. voltage applied thereacross. A feedback DC signal is applied to a terminal 22 in, whereby the frequency of the reference crystal is adjusted to match the expected deviation, e.g., plus or minus 20 Hz, from the assigned carrier frequency Fo of the input R.F. signal. After division by a divider, the output of the reference crystal is applied to one input of a phase comparator. The other input to the phase comparator is provided by a variable divider connected to the thumbwheel switches 24a, b and c. A voltage control oscillator (VCO) inputs a high frequency signal into the variable divider. The output of the phase comparator after passing through a low pass filter is applied to the VCO, whereby it's output frequency is adjusted accordingly. The output of the VCO is applied to the output terminal 22 out.

The divider 20 divides by a factor illustratively of 4, so that the VCO output from the terminal 22 out is initially set to be 4 Fo, where Fo is the carrier frequency of the input R.F. signal to be analyzed. If it is desired to tune a station of 1500 kHz, the digits 1, 5 and 0 are entered via the switches 24a, b and c to divide the output frequency of the VCO by 150 to provide an output signal from the terminal 22out of 6000 kHz. After dividing by 4 in the divider 20, a reference signal of 1500 kHz is applied to the local oscillator inputs of the mixers 14a and 14b.

As is recognized in the art, the carrier frequency Fo of many AM broadcast stations may vary as much as plus or minus 20 Hz from the assigned carrier frequency Fo. To compensate for that variation, the I.F. port of the mixer 14b is connected in a feedback path of low distortion and low noise to provide a D.C. signal to the D.C. control terminal 22 in of the R.F. synthesizer 22, whereby the voltage applied across the reference oscillator may be adjusted and it's output frequency varied accordingly, In particular, the Q component of the input R.F. signal is connected to a low pass filter (LPF) 16b, thus eliminating those relatively high frequencies, e.g., those frequenoies above 100 kHz. The LPF output is amplified by an operational amplifier 18b. The output of the amplifier 18b is fed back via a low pass filter (not shown in FIG. 1) to the D.C. control terminal 22 in. This low pass filter removes the AC components to apply a D.C. signal to the R.F. synthesizer 22. As explained above, that D.C. signal controls the frequency of the reference oscillator of the R.F. synthesizer 22. Thus the frequency and phase of the output taken from terminal 22out is automatically adjusted until the switching signal fed to the mixer 14b is in precise quadrature with the carrier frequency Fo of the input R.F. signal.

Care is taken that the feedback path taken from the IF port of the mixer 14b is of low distortion. In particular, the operational amplifier 18b is selected to have particularly low noise, and very low distortion, which achieves linear demodulation of the input signal. The low pass filters 16a and 16b are designed to limit the demodulation bandwidth and to reduce the out-of-band signals applied to the operational amplifiers 18a and 18b. The operational amplifier 18a and 18b provide a limited gain so that the output of the homodyne receiver 12 is calibrated for a known value, e.g., two volts peak to peak A.C. of the I component from the mixer 14a for 100% amplitude modulation. Also the Q component taken from the mixer 14b has an equivalent amount of quadrature modulation for the proper level of the R.F. input signal. When phase locked, the output of the operational amplifier 18a has also superimposed on it a one volt D.C. signal. The illustrated homodyne receiver 12 provides precise I and Q demodulation of the input R.F. signal, and the spectrum of the input RF signal frequency is translated to 0 and separated in distinct I and Q components. The resulting low frequency or audio signals taken from the outputs of the operational amplifiers 18a and 18b are applied to and processed by a filtering circuitry as will now be explained.

The remaining circuitry of the analyzer 10 shown in FIG. 1 measures and displays the relative amplitude of the modulation distortion or sideband emissions of the input R.F. signal with respect to its amplitude at carrier frequency Fo, on a panel meter 50. As illustrated in FIG. 3, the panel meter displays the relative amplitude of the modulation or sideband distortion in terms of relative dB. A detector switch SW-1 applies a selected signal to be measured. When the detector switch SW-1 is disposed to its position b, the in-phase component I is measured to indicate the modulation distortion due to distortion and clipper products. When the detector switch SW-1 is disposed to its position c, the Q component derived from the operational amplifier 18b is applied to measure modulation distortion due to incidental quadrature modulation, which is related to incidental phase modulation. When the detector switch SW-1 is disposed to its position d, the level of the overall modulation distortion is measured. That measurement requires the use of a low frequency chopper 26, which alternately applies the I and Q components to be measured. In addition, when the switch is disposed to its position a, an external audio input is connected, whereby the audio source material fed to the transmitter's modulator may also be analyzed.

A second switch SW-2 determines the function of the analyzer 10 and the particular type of filtering imposed upon the signal selected by the detector switch SW-1. As indicated in FIG. 1 by the dotted line, the second measurement switch SW-2 is connected to be switched in unison with a third R.F. calibration switch SW-3. Each of the switches SW-2 and SW- have five positions a,b,c,d and e. In the first position a, the D.C. component of the in-phase signal I is applied to a logarithmic amplifier 48 to provide a display on the panel meter 50. That I component represents the full amplitude of the R.F. input signal at its carrier frequency Fo. A suitable variable attenuator (not shown in FIG. 1) is incorporated prior to the terminal 11 so that the level of the I component derived from the operational amplifier 18a may be normalized, i.e., set to 1.00V D.C., corresponding to a full scale reading of the panel meter 50.

In the remaining four positions b-e of the measurement switch SW-2, a selectively filtered signal is applied to be measured. The selected signal is rectified by a full wave rectifier 44, before being integrated by quasi-peak detector 46. The ballistics, i.e. the charge and discharge time constants of the quasi-peak detector 46, are set to match the integration factors of the human ear. As a result, the readings displayed upon the panel meter 50 are equivalent to the interference level perceived by a listener. This is, of course, exactly the desired measurement, in that the purpose of the analyzer 10 is the measurement of objectional interference. The scale of the detected signal is compressed by a logarithmic amplifier 48, whose output is displayed by the panel meter 50 on a scale indicative of the dB drop of the sideband emissions with regard to the amplitude of its R.F. signal at the carrier frequency Fo.

As illustrated in FIG. 1, the signal selected by the second measurement switch SW-2 is also applied via an audio power amplifier 40 and a speaker 42, whereby a user may hear a sound corresponding to the modulation distortion present in the sidebands of the input R.F. signal.

In the position b of the switches SW-2 and SW-3, all components of the signal selected by the detector switch SW-1, i.e., those signal components in the bandwidth of 0-100 kHz of the carrier frequency Fo, are displayed upon the panel meter 50, i.e., all of the audio and modulation distortion components are measured. Significantly, this homodyne receiver 12 is capable of outputting distinct I and Q components and dependent upon the setting of the detector switch SW-1, these components may be separately displayed upon the panel meter 50. In the third position c of the measurement switch SW-2, a sharp high pass filter (HPF) 28 is inserted to filter the signal selected by the detector switch SW-1. The HPF 28 passes those frequency components above a selected frequency, e.g., 11 kHz, so that the spectrum between 11 kHz and 100 kHz on either side of the carrier frequency Fo is displayed upon the panel meter 50. That spectrum corresponds to the total spectrum of the modulation distortion outputted by the homodyne receiver 12.

In the fourth and fifth positions d and e of the measurement switch SW-2, the output of the HPP 28 is applied to a circuit which functions as an easily tuned bandpass filter. The R.F. spectrum which has been frequency translated by the homodyne receiver 12 and the resultant low frequency signals filtered by the high pass filter 28, are applied to one input of an analog multiplier 30. The other input of the multiplier 30 is supplied by a synthesized sine generator 34. The analog multiplier 30 produces output frequencies which contain both the sum and the difference of the frequencies from the HPF 28 and the sine generator 34. Only the difference frequencies are passed by the LPF 32. If the LPF 32 had a bandwidth of 3 kHz, it would pass only those frequencies from the HPF 28 which were within 3 kHz of the frequency of the sine wave, thereby creating in effect a bandpass filter with a bandwidth of two times the bandwidth of the LPF 32. By simply varying the frequency of the sine generator 34, the center frequency Fc of the thus created band pass filter can be easily adjusted. In this instance, the sine generator 34 is synthesized, thus the center frequency Fc of the band pass filter is precisely set in integral steps.

The significance of the choice of the analog multiplier 20 and the sine generator 34 should be noted. An analog multiplier 30 in its ideal form produces an output spectrum which contains only components which are the simple sum and difference of the input frequencies. This differs from a mixer wherein one input may be switched which creates outputs which include frequency spectra around the odd multiples of the switching frequency. In the instance of multiplier 30, the purity of the frequency addition and subtraction is further assured by employing the sine generator 34 of low distortion. In the illustrated embodiment, the modulation distortion may vary approximately from 11 to 100 kHz. The choice of the center frequency Fc of that window or segment is made by entering two digits via the thumbwheel switches 36a and 36b.

The multiplier output is applied to a low pass filter (LPF) 32, which sets the bandwidth imposed by the LPF 32. As will be shown with respect to FIG. 2F, a selected one of a plurality of LPF may be connected to the multiplier output, whereby a band width may be set for the tunable window. In the fourth position d of the measurement switch SW2, the relative amplitude of the emission within the selected tunable window is displayed upon the panel meter 50. In switch position d, that distortion within a relatively high amplitude range, e.g., emission levels from 0 to 45 dB below the calibration reference level, may be observed upon the panel meter 50. In the fifth position e, the output of the low pass filter 32 is applied to an operational amplifier 38 which supplies a 40 dB gain (illustratively) to the LPF output, before it is displayed upon the panel meter 50. In the fifth position e, a relatively low amplitude range of the distortion signals between 40 dB and 85 dB below the calibration reference, are displayed.

As illustrated in FIG. 1, the analyzer 10 is provided with an alarm feature. In particular, the output of the logarithmic amplifier 48 is applied to a compare circuit 52, which compares the amplitude of the logarithmic amplifier output with a preset level and, if greater, an alarm, either visual or audible, is energized to alert station personnel that the modulation distortion exceeds a set limit.

FIGS. 2A-2F show the detailed circuitry of the modulation distortion analyzer 10 generally shown in FIG. 1. Referring initially to FIG. 2A, the detailed circuitry of the R.F. synthesizer 22 will now be described. Generally, the R.F. synthesizer 22 generates at its output terminal 22out a synthesized R.F. signal at a frequency selected by the frequency controlled thumb wheel switches 24a, b and c. These switches provide binary coded decimal signals bearing the selected frequency and are applied to an EPROM 88, which converts that frequency to a binary number at its outputs Q0 to Q7. These outputs are connected in parallel to the inputs N0 to N7 of a phase locked loop (PLL) frequency synthesizer 80.

A voltage controlled crystal oscillator (VCXO) 71 is formed by a reference crystal 70 and a CMOS inverting hex buffer 72 connected in parallel therewith. The referred to D.C. control voltage derived from the operational amplifier 18b is applied to the VCXO 71, whereby its reference frequency is increased or decreased. The buffer output is supplied through a further buffer 74 to a decade counter/divider 78. The divider 78 may be adjusted to divide by a factor of 9 or 10 by appropriately connecting its reset to ground or its output Q9. Thus, the VCXO output may be divided by 9 or 10, whereby a 10 kHz or 9 kHz channel spacing may be achieved. As will be explained, the PLL frequency synthesizer 80 divides the divider output by a number selected by the frequency control thumb wheel switches 24a, b and c.

The synthesizer output is applied to a LPF 81 comprised of an operational amplifier 82 and capacitors C9-C13 and resistors R7-R13. This is the PLL loop filter that generates phase error signals to control the output frequency of a voltage controlled oscillator (VCO) 83. The VCO 83 is comprised of a varactor diode CR2, an FET 84 and a buffer transistor 86. The D.C. voltage at the node of resistor R7 and capacitor C9 controls the capacitance of the varactor diode CR2 and, thereby, the frequency of the VCO 83.

The buffered VCO output is supplied to a divider 91, which is comprised of dual high speed CMOS D flip-flop 90 and 92. The Q' output of the flip-flop 90 is tied to its D input. The flip-flop 90 divides the VCO output by two. The output Q' of the flip-flop 90 is applied to clock the flip-flop 92. The Q' output of the flip-flop 92 is also connected to its D input. Thus, the flip-flop 92 divides the VCO output by four.

As shown in FIG. 2A, the Q output of flip-flop 90 and the Q' output of flip-flop 92 are applied to a data selector 93 comprised of four 2 input NAND gates 94a, b, c and d. The data selector 93 selects one of two outputs, i.e., either the VCO frequency divided by two as output from the flip-flop 90 or the VCO output divided by four as derived from the flip-flop 92. The selection is controlled by a thumb wheel switch 24d, which is disposed on the front panel as shown in FIG. 3. Whenever frequencies above 1.000 MHz are selected, the VCO divided by two output is selected. For frequencies below 1 MHz, the VCO divided by four output is selected. Thus, a 2:1 frequency range of the VCO 83 can produce the required 4:1 frequency range of the synthesizer output derived from the NAND gate 94d and applied via the output terminal 22 out to the divider 20 (See FIG. 1). This signal is four times the carrier frequency Fo of the input R.F. signal to be analyzed.

Significantly, the synthesized R.F. signal developed at the NAND gate 94d is fed back and is applied to the F In input of the PLL frequency synthesizer 80 and, in particular, to a first input of a phase comparator internal of the PLL frequency synthesizer 80; the other input to the internal phase comparator is derived from the VCXO 71. In particular, the VCXO output which is divided by either 9 or 10 in the decade counter/divider 78 and is applied via the OSC IN to input provides the desired reference signal to the internal phase comparator. This reference signal is either 40 kHz or 36 kHz depending on the desired channel spacing. As indicated above, the PLL frequency synthesizer 80 divides the selected VCO output by a number selectively set by the frequency control thumb switches 24a, b and c. The internal phase comparator provides signals at the OR and OV outputs of the synthesizer 80. If the reference frequency at OSC In is greater than the selected VCO frequency at F IN or if the OSC IN phase leads the F IN phase, then the output OV will pause low while OR remains essentially high. If the F IN frequency is greater than the OSC IN frequency or if the F IN phase leads the OSC IN phase, then OR will pulse low while OV remains essentially high. If the two signals have the same frequency and are in phase, then both OR and OV remain high except for a small minimal time when both outputs pulse low in phase.

The synthesizer output is applied to the LPF 81. When OR pulses are low, the LPF output falls causing the VCO 83 to reduce it's oscillating frequency. OR will pulse low until the two input signals to the internal phase comparator have the same frequency and are in phase. When OV pulses low, the LPF output voltage increases causing the VCO 83 to increase it's operating frequency. OV will pulse low until the internal phase comparator signals have equal frequency and are in phase. In this fashion, the feedback loop shown in FIG. 2A (including the PLL frequency synthesizer 80) controls the output frequency and phase of the VCO 83 so that the synthesizer frequency outputted by the VCO 83, is locked at four times the carrier frequency Fo.

The frequency of the output of the VCXO 71 will remain nearly constant at 2.88 MHz. As the DC control voltage supplied from the operational amplifier 18b increases or decreases, the VCXO frequency will vary by 150 Hz. The output of the VCO 83 is capable of a much wider frequency swing than that of the VCXO 71, ranging from approximately 7.2 MHz to 14.4 MHz. The buffered output of VCXO 71 is applied to a ripple counter 76, which effectively divides the VCXO output to provide a 180 kHz reference signal, which is supplied to the synthesized sine generator 34.

Referring now to FIG. 2B, there is shown a detailed schematic drawing of those components of the modulation distortion analyzer 10 used to mix or demodulate the input R.F. signal into its I and Q components. Generally, FIG. 2B shows the demodulators or mixers 14a or 14b, the chopper 26 and the detector switch SW-1. The detector switch SW-1, generally shown in FIG. 1, is comprised of a control 55 mounted on the front panel 54 of the analyzer 10, and connected via lines to the inputs of a multiplexer 118 as shown in FIG. 2B.

The input R.F. signal is input through a LPF 101 formed by the capacitors C6 and C9, and inductor L1. Protective diodes CR1 and CR2 become active if excessive RF input is present. Resistors R2 and R3 form a minimum loss matching pad for a zero degree hybrid L2. The hyorid L2 equally divides the input RF signal with zero phase difference therebetween. The hybrid outputs are applied to the RF inputs of the in-phase synchronous detector or mixer 14a and the quadrature synchronous detector or mixer 14b.

The reference synchronized R.F. signal from the R.F. synthesizer 22 is coupled to the CLK input of a dual D ECL flip-flop 20, which divides the reference synthesized R.F. signal by four yielding two balanced, carrier frequency signals. These two signals are in quadrature (90 degree phase angle therebetween) and are connected to the mixers 14a and 14b so that the mixer 14a demodulates the in-phase component I and the mixer 14b demodulates the quadrature component Q of the input R.F. signal.

The balanced output of each of the mixers 14a and 14b is passed through it's LPF 16a and 16b respectively, to eliminate the demodulated components of any R.F. signals more than 100 kHz from the carrier frequency Fo. As shown in FIG. 2B, the LPF 16a is comprised of inductor L3 and capacitors C4 and C5, whereas the LPF 16b is comprised of the inductor L4 and the capacitors C10 and C11. The LPF outputs are applied and converted to imbalanced form by the operational amplifiers 18a and 18b. The operational amplifiers 18a and 18b are respectively associated with their trimmers R5 and R29. The trimmer R29 is set for zero volts under no signal conditions. The trimmer R5 is set for minimum drift in voltage under no signal conditions.

The I component at the output of the operational amplifier 18a contains a DC component due to the in-phase synchronous detection. When a measurement control 58 of the switch SW-2 is set to it's first position a, an RF CAL control 61 (see FIG. 3) may be adjusted for a zero dB reading on the panel meter 50; when so adjusted, the DC voltage appearing at the output of the operational amplifier 18a will be 1.00 Vdc. This adjustment sets a demodulation reference so that symmetrical 100% AM modulation will produce a 2.00 peak-to-peak voltage at the output of the operational amplifier 18a with the negative trough just grazing 0.00 Vdc. Similarly, symmetrical 100% quadrature modulation will produce a 2.00 peak-to-peak voltage of the Q component appearing at the output of the operational amplifier 18a with no DC component.

The I component signal is also connected to a lock detect circuit 104 comprising an operational amplifier. The I component signal is also coupled through capacitor C3, which eliminates the DC component, and also to the multiplexer 118 of the detector switch SW-1.

The demodulated Q component is coupled through a capacitor C16 to the multiplexer 118 and to a buffer 116. The Q component is also connected to the VCXO loop filter 115 comprised of an operational amplifier 114, capacitors C23 and C25, and resistors R45, R47 and R46. If any phase difference exists between the input R.F. signal and the local oscillator signal of the mixer 14A, a DC voltage will appear at the output of the operational amplifier 18b. The filter 115 integrates that DC voltage producing a change in the DC control voltage applied to the input terminal 22in of the R.F. synthesizer 22. This voltage change adjusts, as explained above, the frequency of the reference crystal 70, thereby reducing the phase difference and returning the DC voltage at the output of the operational amplifier 18b to 0.00 Vdc.

If the reference synthesized signal outputted from the R.F. synthesizer 20 through the divider 20 is not phase locked to the input R.F. signal, no DC voltage will appear at the output of the operational amplifier 18b. Under those conditions, the voltage appearing at the input 2 of the lock detector 104 will fall below that voltage appearing at the other output 3, causing its output to rise. As a result, a transistor 105 will turn on energizing the front panel LED alarm 65 as shown in FIG. 3, to signal the loss of phase lock. When phase lock has been lost, the analog switches 102, 110 and 112 will be turned on and the analog switch 100 will be turned off, whereby resistors R43 and R44 are inserted into the circuitry of the VCXO loop filter 115, thereby widening the loop bandwidth to widen the PLL capture range and to reduce lock time. Since resistor R3 is out of the circuitry of the filter 115, the time for the operational amplifier 114 to recognize lock is extended to allow for loop damping.

As shown in FIG. 2B, each of the I and Q component signals, as well as an external audio signal are connected to the multiplexer 118 of the detector switch SW-1. Dependent upon which select signal is applied from the control 55 to the inputs of the multiplexer 118, the corresponding current flows through it's associated resistor R25, R32 or R34 respectively, to the summing node or input of an operational amplifier 117. The operational amplifier 117 maintains the summing node at zero volts resulting in an inverted version of the selected signal at the output of the operational amplifier 117. When the control 55 of the detector switch SW-1 is set to it's fourth position d, the chopper 26, which is comprised of an oscillator and divider, is enabled producing an approximately 1 Hz chop signal, which is applied to the multiplexer 118, causing it to alternately select between the I component signal and the Q component signal. The signal selected by the multiplexer 118 is applied to the HPF 28 as generally shown in FIG. 1 and more specifically shown in FIG. 2E.

Referring now to FIG. 2C, the synthesized sine generator 34 provides a highly pure sine wave of a frequency selected over a wide frequency range of 10 kHz to 100 kHz. The selected frequency is set by the thumbwheel switches 36a and 36b. The output of the generator 34 is applied to the analog multiplier 30. A 180 kHz reference signal generated by the R.F. synthesizer 22 is applied to the clock input of a decade counter 124, whose output Q9 is connected it its reset input, whereby the 180 kHZ reference signal is divided by 9. The decade counter output is applied to one input of a phase comparator 126. The other input a feedback signal developed by a VCO 131 comprised of FET 132, inductor L3, capacitor C8, varactor CR3 and resistor R10 connected in a Hartley configuration. The output of the phase comparator 126 is a phase error signal, which is applied via a loop filter 128 to adjust the frequency of the VCO 131 so that the signal at the other input of the phase comparator 126 is locked at 20 kHz and in phase with the 20 kHz reference signal developed by the decade counter 124.

The output of the VCO 131 is buffered by an FET 130, before being applied to a Schmitt trigger gate 133 to produce a square wave. A ripple counter 134 divides that square wave by 2, 4 and 8. The square wave and the divided outputs of the ripple counter 134 are connected to a digital multiplexer 136, which selects one of the four input signals depending upon the high 3 bits of the most significant digit derived from the frequency offset thumbwheel switches 36, i.e., switch 36a. If the switch 36a is set to 80 or above, the square wave is selected. If the switch 36a is set to 40-79, the divide by 2 signal is selected. If the switch 36a is set to 20-39, the divide by 4 signal is selected. If the switch 36a is less than 20, the divide by 8 signal is selected. In this manner, the required 10:1 frequency range is generated upon the feedback path by the VCO 131 with only a 2:1 frequency range.

The feedback path for the VCO 131 includes a programmable divide comprised of a pair of BCD counters 138a and 138b, which divides the feedback output from the digital multiplexer 136 by a number set on the offset thumbwheel switches 36a and 36b. As explained above, the entered number controls the frequency of the sine wave outputted by the synthesized sign generator 34 and applied to the analog multiplier 30. If, for example, the switches 36a and 36b are set to 20, the frequency of the signal developed at the output of the digital multiplexer 136, will be divided by 20. The output of this variable divider is applied to the other input of the phase comparator 126. Since the described PLL maintains the frequency of the signal applied to the other input of the phase comparator 126 at 20 kHZ, the frequency of the signal at the output of the multiplexer 136 will be the setting of the switches 36 times 20 kHz. In this example, the frequency of the multiplexer output would be 20 times 20 kHz or 400 kHz. Thus, the frequency at the multiplexer output is 20 times the frequency of the desired sine wave as selected by the offset thumbwheel switches 36a and 36b.

Further, the multiplexer output is fed to a Johnson counter 141, which is formed by the counters 140 and 142, and an operational amplifier 143. A power-up reset network including an operational amplifier 139 ensures that the counters 140 and 142 begin counting at a zero count for proper division by 20. A sine wave shaping network 147 is formed by the resistors R13–R23 to produce a stepped or sampled data version of the sine wave with a DC component. The shaping network output is applied through a capacitor C19, which removes the DC component, before being applied to a LPF 145, which is composed of inductors L1 and L2, capacitors C13–C17 and a terminating resistor R11. The LPF 145 removes the sampling frequency components and outputs through a buffer 144 a pure sine wave to be applied to the analog multiplier 30.

Referring now to FIG. 2D, the base band selected by the detector switch SW-1, i.e., the I component, the Q component, the chopped I and Q components or an external source, is supplied to the measurement switch SW-2, which is comprised of an analog multiplexer 168, a buffer 170 and a multi-position measurement control 58 disposed on the front of the analyzer panel 54, as shown in FIG. 3. Inputs from the measurement control 58 are supplied to the S0–S2 inputs of the multiplexer 168. As shown FIG. 2D, the output of the HPF 28 is supplied to input E of the multiplexer 168, the output of the LPF 32 as selected by the offset BW switch 59 is supplied to the I5 input, and an amplified version of that signal from the +40 dB operational amplifier 38 is supplied to pin I6. As will be explained, the last four positions b-e of the control 58 determine which of these four inputs will be output by the multiplexer 168.

The output of the multiplexer 168 is inverted and amplified by a buffer 170 before being applied to the full wave rectifier 44. The full wave rectifier 44, which comprises operational amplifiers 169 and 171, takes the absolute value of the signal selected by the multiplexer 168. The absolute value provided by the full wave rectifier 44 is applied to the quasi peak detector 46. When the offset BW switch 59 is disposed to it's 0.5 kHz position a, an analog switch 154 is closed to change the attack and decay times of the detector 46 to increase the readings in order to mimic the response of a spectrum analyzer. The detector output derived from the operational amplifier 160 is supplied to the logarithmic amplifier 48, which is comprised of operational amplifiers 162 and 166 and the emitter connected transistors 164.

When the measurement control 58 is set to it's RF CAL position a, a signal is applied to the analog switch 152, closing that switch whereby the amplified output of the decoder or mixer 14a is supplied via the operational amplifier 18a, the switch 152 to the logarithmic amplifier 48. The mixer output has a DC level proportional to the amplitude of the carrier signal, nominally 1.00 Vdc. The logarithmic amplifier 48 includes a gain control in the form of a potentiometer R51, which is set for a 0 dB level under this condition. The operator will adjust an RF CAL switch 61 to 0 dB so that the in-phase mixer output will have it's nominal 1.00 Vdc level and the analyzer 10 is calibrated.

The logarithmic amplifier 48 also includes a LOG ZERO control in the form of a potentiometer R39 which is set for a $-45$ dB reading. The panel meter 50 indicates zero when measuring modulation that produces $-45$ dB sidebands. The measurement switch SW-2 includes a potentiometer 45, which is set so that 100% modulation produces a $-6$ dB reading on the panel meter 50. Similarly, a potentiometer R13, coupled in circuit between the HPF 28 and the multiplexer 168, is set so that 100% modulation at frequencies between 11 and 100 kHz produces a $-6$ dB reading. The full wave rectifier 44 includes a DETECTOR OFFSET CONTROL in the form of a potentiometer 38, which is set to compensate for the offsets of the operational amplifiers 16 and 171 of the rectifier 44 and also of the operational amplifiers in the quasipeak detector 46.

The output of the logarithmic amplifier 48 is applied through an analog switch 172 and is buffered by an operational amplifier 174. The diode CR8 prevents the output of the operational amplifier 174 from dropping below 0 Vdc when logarithmic amplifier output goes negative. Meter currents flow through the resistor R44 to the panel meter 50.

The logarithmic amplifier output is also applied to one input of a compare circuit 52, whereas the other input is derived from the wiper of an ALARM SET control 63. Whenever the logarithmic amplifier output exceeds the alarm set voltage, the output of the compare circuit 52 supplies an energizing signal via an optoisolator 176 to a panel alarm in the form of an LED 65, as shown in FIG. 3, and also to remote alarm terminals. Resistor R4 provides a small positive feedback for hysteresis so that the transitions by the compare circuit 52 are rapid despite a slowly varying input. The diode CR3 prevents activation of the remote alarm when phase lock circuit 105 of FIG. 2B energizes the alarm LED 65.

When an ALARM control 56 is disposed to it's SET position b, a signal is supplied to the analog switch 172b rendering it conductive so that the alarm set voltage from the wiper of the ALARM SET control 63 is supplied through the closed analog switch 172, the buffer 174 to be displayed as an alarm threshold on the panel meter 50. When the ALARM control 56 is in it's OFF position a, the analog switch 172 is set so that the inverting input of the compare circuit 52 is grounded, thus disabling the alarm.

Referring now to FIG. 2E, a detailed circuit schematic of the high pass filter (HPF) 28. The HPF 28 is an eleventh order elliptical high pass filter with a passband of 11 kHz and above. The filter output is applied to the analog multiplier 30, which is used in the offset mode of operation to analyze a selected spectrum segment of the base band. The base band signal selected by the detector switch SW-1 is inputted through a buffer 204 and a resistor R32, which provides the correct source impedance for the HPF 28.

As illustrated in FIG. 2E, the HPF 28 is structured as a ladder of series capacitors and shunt traps. Capacitors C28, C27, C22, C17 with C16, C13, C9 and C4 are the series capacitors. The shunt traps determine the zeros of the HPF 28 and are series tuned circuits to ground formed by capacitors C23, C18, C14, C10 and C6 in series with simulated inductors of the gyrator circuits 206, 208, 210, 212 and 214 respectively. Each shunt trap has a switch W connected therewith, which may remove the trap from the filter for testing and critical adjustment. In operation, the switch or jumpers W should be in their 1-2 position. The HPF 28 is terminated by a resistor R4.

The filter output is amplified by an operational amplifier 200 before being applied to an X input of the analog multiplier 30. As shown in FIG. 2E, the sine wave generated by the synthesized sine generator 34 is amplified by an operational amplifier 202 and thereafter applied to the Y input of the multiplier 30. The amplified output of the HPF 28 is also supplied through a buffer 204 to the measurement switch SW-2. When the control 58 is disposed to it's 0 to 100 kHz position b, the entire selected base band is processed and displayed upon the panel meter 50. The output of the operational amplifier 200 is adjusted by a potentiometer R37, which is set for the correct meter reading in the offset mode of operation for minimum feedthrough. The output of the multiplier 30 is the analog multiplication of it's X and Y input signals and contains the sum and difference frequencies of these inputs, which are supplied to the LPF 32.

Referring now to FIG. 2F, the detailed circuitry of the low pass filter (LPF) 32 is shown as comprising a 0.5 Hz low pass (LP) filter 184, a 3 kHz LP filter 182, and an NRSC LP filter 180. Provision is made for a fourth, optional filter which may be readily incorporated into the modulation distortion analyzer 10 for customization o to meet the requirements of future rule making. The offset bandwidth (BW) control 59 is disposed on the front plate 54 of the analyzer 10, as shown in FIG. 3. The control 59 has four positions a-d for determining which output of the filters 180, 184 or the optional filter, is to be selected and applied to the measurement switch SW-2. Each of the filters 180, 182 or 184 selects a portion or bandwidth of the difference frequency signal outputted from the multiplier 30 so that bandwidth disposed about the center frequency Fc selected by the synthesized sine generator 34, may be measured and displayed upon the panel meter 50.

The difference signal output by the analog multiplier 30 is applied through a DC blocking capacitor C16 and resistor R12 to remove any DC voltage therefrom. Thereafter, an operational amplifier 185 amplifies the difference signal and applies it to each of the filters 180, 182 and 184. The filter 184 is an 8 pole Butterworth 0.5 kHz low pass filter used to simulate a spectrum analyzer and is comprised of the operational amplifiers 190a–190d and their associated capacitors and resistors. It's output is taken from the output of the operational amplifier 190d. The filter 182 is an 8 pole Butterworth 3 kHz low pass filter used to simulate a narrow band receiver; it is comprised of the series of operational amplifiers 188a–188d. The operational amplifier 188d provides the output of the filter 182. The filter 180 is also an 8 pole Butterworth low pass filter comprised of the series of operational amplifiers 186a–186d. The input of the filter 180 is fed by a notch filter 181, which is a biquad 10 kHz notch filter, which removes interference from adjacent channel carriers. The output of the filter 180 derived from the operational amplifier 186d is supplied to an NRSC deemphasis circuit 187. The notch filter 181, the LPF 180 and the NRSC de-emphasis circuit 187 simulate a wide band NRSC receiver.

The output of which filter 180, 182 or 184 tube displayed is determined by the offset BW control 59, which has four positions a-d, corresponding to the filters 180, 182, 184 and the optional circuit. Select signals developed by that control 59 are supplied, as shown in FIG. 2F, to a multiplexer 191. The NRSC filter output, the 3 kHz filter output, the 0.5 kHz filter output and the optional filter output are coupled to the inputs of the multiplexer 191. Dependent upon which one of the positions a–d of the control 59 is set, that filter output is inverted by an operational amplifier 192 and is supplied to be measured and displayed upon the panel meter 50. A signal current from the selected filter flows through it's associated resistor R27, R32, R37 or R38 and the multiplixer 191 to the summing junction of the invertor 192. The output of the invertor 192 is an inverted version of the selected filter output. When the control 58 of the measurement switch SW-2 is set to it's 0 to −45 dB position d, the inverted output of the invertor 192 is supplied directly to be displayed upon panel meter 50. If the control 58 is set to it's −40 to −85 dB position e, the selected filter output is amplified 100 times by the operational amplifier 38 (corresponding to a +40 dB gain) to be measured and displayed.

In considering this invention, it should be remembered that the present disclosure is illustrative only and the scope of the invention should be determined by the appended claims.

I claim:

1. Apparatus for examining a selected segment of a base band signal produced by demodulating an R.F. modulated signal having a carrier frequency Fo, said examining apparatus comprising:
   a) homodyne means for demodulating the R.F. modulated signal to provide a base band signal to effectively remove therefrom said carrier frequency Fo;
   b) means for generating a reference signal of a frequency offset from said carrier frequency Fo by a selected amount;
   c) means for receiving and multiplying said reference signal and said demodulated baseband signal to provide a difference signal indicative of the frequency difference therebetween centered about said offset frequency; and
   d) first filter means for receiving said difference signal and for passing only those frequencies below a first predetermined frequency to provide a spectrum window thereof whose bandwidth is limited to that segment of said base band to be examined.

2. Apparatus for demodulating an R.F. modulated signal to provide a base band signal, said R.F. modulated signal having a carrier signal of known carrier frequency Fo, said demodulating apparatus comprising:
   a) means for receiving said R.F. modulated signal;
   b) variable oscillator means for generating a first reference signal dependent upon the amplitude of an error signal applied thereof;
   c) a reference oscillator responsive to the phase of said demodulated signal for providing a second reference signal of a second reference frequency;
   d) a selectively variable divider means for receiving said first reference signal and dividing said first reference signal by a selected number to provide a third divided signal whose third frequency is proportional to said first frequency divided by said selected number;

e) a comparative for comparing the phase of said second reference signal with that of said third divided signal to generate said error signal in accordance with the phase difference therebetween;

f) means for applying said error signal to said variable oscillator means;

g) means connected to said receiving means and said variable oscillator means for receiving respectively said received R.F. modulated signal and said first reference signal for demodulating said received R.F. modulated signal to produce said base band signal; and h) a feedback path for applying said base band signal indicative of any phase difference between said R.F. modulated signal and said first reference signal to said reference oscillator means, whereby said reference oscillator means is phaselocked to said R.F. modulated signal.

3. The demodulating apparatus as claimed in claim 2, wherein there is included means for selecting said number in accordance with the desired carried frequency Fo to be demodulated and for applying said selected number to said variable divider means.

4. The demodulating apparatus as claimed in claim 2, wherein there is included a low pass filter connected to receive said error signal from said comparator for removing substantially any demodulation components from said error signal and for outputting and applying a filtered signal to said variable oscillator means.

5. Apparatus for examining a selected segment of a base band signal produced by demodulating an R.F. modulated signal having a carrier frequency Fo and sidebands with distortion therein, said examining apparatus comprising:

a) means for demodulating said R.F. modulated signal to provide a base band signal;

b) means for generating a reference signal of a frequency offset from said carrier frequency Fo by a selected amount;

c) first filter means connected to said demodulating means for receiving said base band signal for removing therefrom those frequencies above a first predetermined frequency and for outputting a filtered signal representative of the distortion appearing in said sidebands and without any fundamental components of said base band;

d) means for receiving and multiplying said reference signal and said filtered signal to provide a difference signal indicative of the frequency difference therebetween centered about said frequency offset;

e) second filter means for receiving said difference signal and for passing only those frequencies below a second predetermined frequency to provide a spectrum window thereof whose bandwidth is limited to that segment of said base band signal to be examined;

f) switch means for selecting one of said base band signal, said filtered signal or said spectrum window; and g) display means for receiving said selected one signal for displaying an indication of it's amplitude.

6. The examining apparatus as claimed in claim 5, wherein there is included means for rectifying said selected one signal, means for integrating said rectified signal and logarithmic amplifier means for compressing logarithmically said integrated signal and for supplying same to said display means, whereby said display means provides a logarithmic indication of the amplitude of said selected one signal.

7. The examining apparatus as claimed in claim 6, wherein there is included means for calibrating said display means such that said displayed amplitude of said selected one signal is relative to the amplitude of said fundamental components of said base band signal.

8. The examining apparatus as claimed in claim 5, wherein there is included amplifier means coupled to receive said spectrum window from said first filter means for providing an amplified signal indicative thereof, said switch means further capable of selecting said amplifier signal and for supplying same to be displayed by said display means.

9. The examining apparatus as claimed in claim 5, wherein there is included an audio transducer means and an amplifier means coupled to said switch means for applying said selected one signal to said audio amplifier means, whereby said amplified, selected one signal is converted to audible signals.

10. Apparatus for demodulating an R.F. modulated signal to provide a base band signal, said R.F. modulated signal having a carrier signal of known carrier frequency Fo, said demodulating apparatus comprising:

a) means for receiving said R.F. modulated signal;

b) variable oscillator means for generating a first reference signal dependent upon the amplitude of an error signal applied thereto;

c) phase shift means for receiving and imparting to said first reference signal a phase shift of precisely 90° to provide a phase-shifted reference signal in quadrature with said first reference signal;

d) a reference oscillator responsive to the phase of said base band signal for providing a second reference signal of a second reference frequency;

e) a selectively variable divider means for receiving said first reference signal and dividing said first reference signal by a selected number to provide a third divided signal whose third frequency is proportional to said first frequency divided by said selected number;

f) a comparator for comparing the phase of said second reference signal with that of said third divided signal to generate said error signal in accordance with the phase difference therebetween;

g) means for applying said error signal to said variable oscillator means;

h) an in-phase mixer and a quadrature mixer respectively coupled to said variable oscillator means and said phase shift means for receiving respectively said first reference signal and said phase-shifted reference signal and each connected to said receiving means for receiving said R.F. modulated signal for demodulating said received R.F. modulated signal to output respectively an in-phase base band signal and a quadrature base band signal; and i) a feedback path for applying said base band signal to said reference oscillator means, whereby said reference oscillator means is phaselocked to said R.F. modulated signal.

11. The demodulating apparatus as claimed in claim 10, wherein said feedback path applies said demodulated quadrature signal to said reference oscillator means.

12. The demodulating apparatus as claimed in claim 10, wherein there is further included display means and first switch means coupled to each of said in-phase and quadrature mixers for selectively outputting one of said demodulated in-phase signal and said demodulated quadrature signal to said display means, whereby the amplitude of said selected demodulated signal is displayed.

13. The demodulating apparatus as claimed in claim 12, wherein there is included means coupled to each of said in-phase and quadrature mixers for alternately sampling each of said demodulated in-phase and quadrature signals for providing an output indicative thereof to said first switch means, whereby said first switch means may further selectively apply said sampled signal to said display means for alternatively displaying said demodulated in-phase and quadrature signals.

14. The demodulating apparatus as claimed in claim 12, wherein there is included first filter means connected to said first switch means for receiving said selected demodulated signal and for providing a first filtered signal which includes only those frequencies above a first pre-determined frequency thus removing the fundamental components of said selected demodulated signal and for applying said first filtered signal to be displayed by said display means.

15. The demodulating apparatus as claimed in claim 14, wherein there is included means for calibrating said display comprising second switch means for first applying said demodulated in-phase signal to said display means and then said first filtered signal said display means, and means for adjusting the scale of said display means when said demodulated in-phase signal is applied thereto, whereby when said first filtered signal is applied to said display means that said first filtered signal will be indicated by said display means in terms of its relative amplitude with respect to the amplitude of the fundamental components of said demodulated in-phase signal.

16. The demodulating apparatus as claimed in claim 15, wherein there is further included logarithmic amplifier means for receiving said selected demodulated signal from said second switch means and for applying a logarithmically compressed signal to said display means, whereby said display means indicates the amplitude of said first filtered signal in dB relative to the amplitude of said fundamental components of said demodulated in-phase signal.

17. The demodulating apparatus as claimed in claim 14, wherein there is further included variable means for generating a third reference signal of a frequency offset from said carrier frequency Fo by a selected amount, means for receiving and multiplying said third reference signal and said first filtered signal to provide a difference signal indicative of the frequency difference therebetween centered about said selected offset frequency, and second filter means for receiving said difference signal and for passing only those frequencies below a second predetermined frequency to provide a spectrum window thereof whose bandwidth is limited to that segment of said demodulated signal to be examined.

18. The demodulating apparatus as claimed in claim 17, wherein there is included second switch means for selecting one of said selected demodulated signal, said first filtered signal or said spectrum window and for supplying said selected one signal to said display means for displaying an indication of its amplitude.

19. The demodulating apparatus as claimed in claim 18, wherein there is further included rectifying means for receiving said selected one signal from said second switch means to provide a full-wave rectified signal indicative of the absolute value of said selected one signal.

20. The demodulating apparatus as claimed in claim 19, wherein there is included a guasi-peak detector for receiving said full-wave rectified signal and comprising charge and discharge time constants set to match the integration factors of the human ear to provide an integrated output signal to be applied to said display means.

21. Apparatus for examining a selected segment of a base band signal produced by demodulating an R.F. modulated signal having a carrier frequency Fo and a sidebands with distortion therein, said examining apparatus comprising:
 a) means for demodulating said R.F. modulated signal to provide a based band signal;
 b) means for generating a reference signal of a frequency offset from said carrier frequency Fo by a selected amount;
 c) first filter means connected to said demodulating means for receiving said base band signal for removing therefrom those frequencies above a first predetermined frequency and for outputting a filtered signal representative of the distortion appearing in said sidebands and without any fundamental components of said base band;
 d) means for receiving and multiplying said reference signal and said filtered signal to provide a difference signal indicative of the frequency difference therebetween centered about said frequency offset; and
 e) second filter means for receiving said difference signal and for passing only those frequencies below a second predetermined frequency to provide a spectrum window thereof whose bandwidth is limited to that segment window thereof whose bandwidth is limited to that segment of said base band to be examined;
 f) said second filter means comprises means for selectively varying said first predetermined frequency, whereby said bandwidth of said spectrum window may be varied accordingly.

22. The examining apparatus as claimed in claim 21, wherein said second filter means comprises a plurality of filters, each for passing only those frequencies below a distinct, predetermined frequency to provide a corresponding distinct spectrum window, and switch means for selecting that spectrum window from one of said plurality of filters according to the desired bandwidth of said spectrum window.

23. The examining apparatus as claimed in claim 22, wherein one of said plurality of filters passes only those frequencies below 0.5 kHz.

24. The examining apparatus as claimed in claim 22, wherein one of said plurality of filters passes only those frequencies below 3 kHz.

25. The examining apparatus as claimed in claim 21, wherein one of said plurality of filters comprises a notch filter for receiving said difference signal, a low pass filter for passing only those frequencies below said second predetermined frequency and an NRSC de-emphasis circuit, whereby said filter simulates a wide band NRSC receiver.

26. The examining apparatus as claimed in claim 21, wherein said generating means comprises means for generating a second reference signal of a second frequency, variable oscillator means responsive to an error signal for generating said first-mentioned reference signal, a selectively variable divider means for receiving and dividing said first-mentioned reference signal by a selected number to provide a third divided signal whose third frequency is proportional to said offset frequency divided by said selected number, and a comparator for comparing the phase of said second reference signal with that of said third divided signal to generate and apply said error signal in accordance with the phase difference therebetween to said variable oscillator means, whereby said first offset frequency is made dependent upon said selected number.

27. The examining apparatus as claimed in claim 26, wherein said demodulating means generates a third reference signal for demodulating the R.F. modulated signal, and said generating means uses said third reference signal to generate said first-mentioned reference signal of said offset frequency.

28. The apparatus of claim 21 wherein said means for generating a reference signal is an adjustable synthesized sine generator.

29. The apparatus of claim 28 wherein said second filter means includes a plurality of filters and includes switching means for selecting one of said plurality of filters.

30. Apparatus for examining a selected segment of a base band signal produced by demodulating an R.F. modulated signal having a carrier frequency Fo, said examining apparatus comprising:
   a) first means for demodulating the R.F. modulated signal to provide a in phase base band signal;
   b) second means for demodulating the R.F. modulated signal to provide a quadrature base band signal;
   c) means for generating a reference signal of a frequency offset from said carrier frequency Fo by a selected amount;
   d) switching means for selecting one of said in phase and said quadrature signals;
   e) means for receiving and multiplying said reference signal and said selected demodulated base band signal to provide a difference signal indicative of the frequency difference therebetween centered about said offset frequency; and
   f) first filter means for receiving said difference signal and for passing only those frequencies below a first predetermined frequency to provide a spectrum window thereof whose bandwidth is limited to that segment of said base band to be examined.

31. Apparatus for examining a selected segment of a base band signal produced by demodulating an R.F. modulated signal having a carrier frequency Fo and sidebands with distortion therein, said examining apparatus comprising:
   a) means for demodulating said R.F. modulated signal to provide a base band signal;
   b) means for generating a reference signal of a frequency offset from said carrier frequency of by a selected amount;
   c) first filter means connected to said demodulating means for receiving said base band signal for removing therefrom those frequencies above a first predetermined frequency and for outputting a filtered signal representative of said distortion appearing in said sidebands and without any fundamental components of said base band;
   d) means for receiving and multiplying said reference signal and said filtered signal to provide a difference signal indicative of the frequency difference therebetween centered about said frequency offset; and
   e) second filter means for receiving said difference signal and for passing only those frequencies below a second predetermined frequency to provide a spectrum window thereof whose bandwidth is limited to that segment of said base band signal to be examined.

* * * * *